United States Patent [19]
Jayaraman et al.

[11] Patent Number: 6,122,417
[45] Date of Patent: Sep. 19, 2000

[54] WDM MULTIPLEXER-DEMULTIPLEXER USING FABRY-PEROT FILTER ARRAY

[75] Inventors: Vijaysekhar Jayaraman, Goleta; Frank H. Peters, Lompoc, both of Calif.

[73] Assignee: W. L. Gore & Associates, Inc., Newark, Del.

[21] Appl. No.: 09/136,202

[22] Filed: Aug. 19, 1998

Related U.S. Application Data

[62] Division of application No. 08/728,029, Oct. 4, 1996, Pat. No. 5,835,517.

[51] Int. Cl.$^7$ ................................................ G02B 6/293
[52] U.S. Cl. ............................ 385/24; 385/35; 372/50
[58] Field of Search .................... 372/23, 44–46, 372/50, 96, 97, 101; 385/15, 24, 27, 33, 35, 39

[56] References Cited

U.S. PATENT DOCUMENTS

| | | | |
|---|---|---|---|
| 4,701,012 | 10/1987 | Kaiser ................................ | 385/24 X |
| 5,073,041 | 12/1991 | Rastani .................................. | 372/43 |
| 5,216,263 | 6/1993 | Paoli .................................... | 372/50 |
| 5,309,468 | 5/1994 | Makiuchi ............................... | 372/50 |
| 5,425,043 | 6/1995 | Holonyak, Jr. et al. ................ | 372/50 |
| 5,633,527 | 5/1997 | Lear ..................................... | 372/50 |
| 5,724,376 | 3/1998 | Kish, Jr. et al. ...................... | 372/96 |
| 5,835,517 | 11/1998 | Jayaraman et al. .................... | 372/50 |

FOREIGN PATENT DOCUMENTS

| | | |
|---|---|---|
| 0 193 106 | 9/1986 | European Pat. Off. . |
| 58-171018 | 7/1983 | Japan . |

OTHER PUBLICATIONS

Hirabayashi et al. "Tunable Wavelength–Selective Demultiplexer Using a Liquid–Crystal Filter" IEEE Photonics Tech. Letters vol. 4, No. 7, Jul. 1992, pp. 737–740.

Pezeshki et al. "Vertical Cavity Waveguide Spectrometer for WDM Communication" Proceedings of the Lasers and Electro–Optics Society Annual Meeting, Ieee pp. 198–199, Nov. 15, 1993.

Soole et al., "Wavelength Precision of Monolithic InP Grating Multiplexer/Demultiplexers", Electronic Letters Apr. 14, 1994, vol. 30 No. 8, pp 664–665.

Bissessur et al. "Turnable Phased–array Wavelength Demultiplexer on InP" Electronic Letter Jan. 5, 1995, vol. 31, No. 1, pp. 32–33.

Primary Examiner—John D. Lee
Attorney, Agent, or Firm—Victor M. Genco, jr.

[57] ABSTRACT

A compact WDM optical device can demultiplex an optical laser signal containing several different wavelengths corresponding to particular channels, and, in reverse operation operate as a multiplexer to interleave several different wavelengths into a multiplexed multi-channel optical laser signal with improved insertion loss characteristics. The optical device includes a linear array of passive resonant optical cavities, in the form of Fabry-Perot filters, extending in a lateral direction and an integral array of associated microlenses extending in the lateral direction. Each microlens has a center which is offset from the central longitudinal axis of an associated Fabry-Perot filter to reflect laser radiation through the device. Each optical cavity is tuned by adjusting the longitudinal dimension thereof to a particular wavelength contained in the multi-channel optical signal. A stepped-wavelength steered laser radiation source for the optical device uses a VCSEL array with offset microlenses. With an additional row of microlenses the optical device can be used for wavelength routing and channel dropping applications. A stepped-wavelength WDM VCSEL array can be similarly organized to form a WDM combiner or multiplexer.

10 Claims, 5 Drawing Sheets

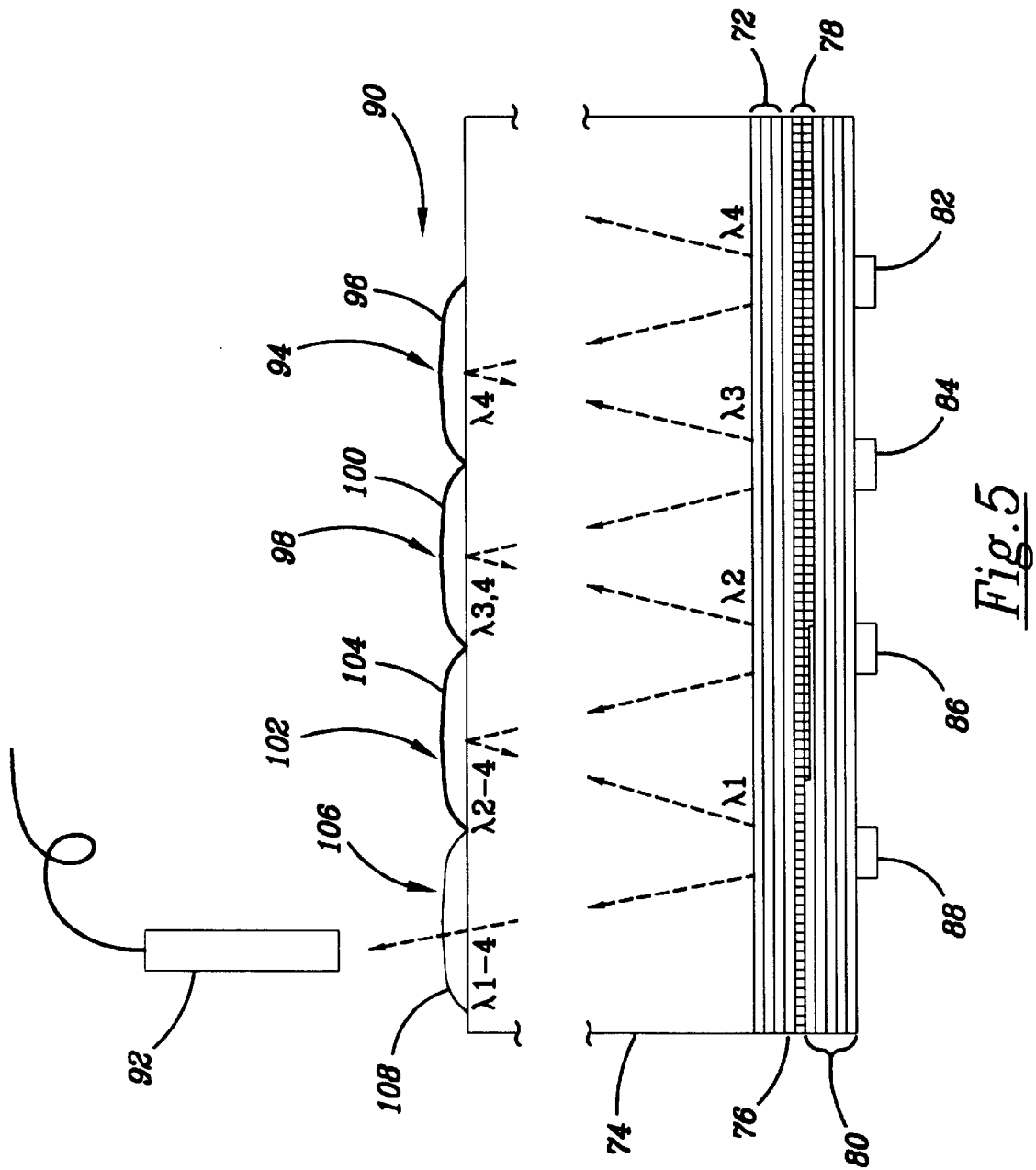

WDM MULTIPLEXER-DEMULTIPLEXER USING FABRY-PEROT FILTER ARRAY

CROSS-REFERENCE TO RELATED APPLICATION

This application is a divisional of application Ser. No. 08/728,029 filed Oct. 4, 1996, now U.S. Pat. No. 5,835,517.

FIELD OF THE INVENTION

This invention relates generally to wavelength-division multiplexing and demultiplexing techniques, and more particularly to optical devices for multiplexing and demultiplexing several different wavelengths of laser radiation.

BACKGROUND OF THE INVENTION

Wavelength-division multiplexing (WDM) systems place several different wavelengths of laser radiation into a single optical fiber (multiplexing) at the transmitter, and spatially separate the wavelengths at the receiver (demultiplexing). Most previous wavelength-division multiplexing schemes are either expensive and bulky, or suffer from poor insertion loss characteristics.

One previous approach is to use a "star coupler", in which all of N (an integer number of) wavelengths are sent to N different optical fibers. In each optical fiber, an in-line Fabry-Perot filter passes one wavelength only. This approach, in addition to being expensive because of the fiber-Fabry-Perot filters, has a very poor insertion loss of 1/N, where N is the number of wavelengths (i.e., channels). For N channels, an insertion loss of 1/N means that each channel has been attenuated by a factor of 1/N after the combining process.

Other multiplexer/demultiplexer schemes include a monolithic array grating ("MAGIC") demultiplexer which is described by Soole et al., in an article entitled *"Wavelength Precision of Monolithic InP Grating Multiplexer/Demultiplexers"*, Electronics Letters, Apr. 14, 1994, Vol. 30, No. 8, pp. 664–665. A waveguide routing approach is described by Bissessur et al., in an article entitled *"Tunable Phased-Array Wavelength Demultiplexer on InP"*, Electronics Letters, Jan. 5, 1995, Vol. 31, No. 1, pp. 32–33. The MAGIC device is essentially a curved on-chip grating, which simultaneously focuses the incoming light and reflects beams to separate locations depending on wavelength. The wavelength router allows multiple wavelengths to diffract and overlap, with constructive interference occurring in separate spatial locations depending on the wavelength. Both the MAGIC and waveguide routing approaches require several centimeters of on-wafer length and have high insertion loss characteristics.

SUMMARY OF THE INVENTION

A compact WDM multiplexer-demultiplexer optical device according to the invention is able to demultiplex an optical laser signal containing several different wavelengths corresponding to particular channels, and, in reverse operation operate as a multiplexer to interleave several different wavelengths into a multiplexed multi-channel optical laser signal with improved insertion loss characteristics.

In an illustrative embodiment, the monolithic multiplexer-demultiplexer optical device includes a linear array of passive resonant optical cavities, in the form of Fabry-Perot filters, extending in a lateral direction and an integral array of associated microlenses extending in the lateral direction. Each microlens has a center which is offset from the central longitudinal axis of an associated Fabry-Perot filter to reflect laser radiation through the device. The optical device includes a plurality of layers of semiconductor. The layers are epitaxially grown or deposited in the longitudinal direction on a semiconductor substrate. The layers create on the substrate a first Bragg reflection mirror, a spacer region (without an active medium) consisting essentially of layers of lattice-matched material, and a second Bragg reflection mirror. Each optical cavity (i.e., Fabry-Perot filter or equivalent) is tuned by adjusting the vertical (i.e., longitudinal) dimension thereof to a particular wavelength contained in the multi-channel optical signal. The multiplexer-demultiplexer optical device can be fabricated in a number of different ways.

According to a first fabrication technique, the substrate and microlenses are fabricated from a semiconductor material (or materials) selected from the group consisting of GaAs, InP, GaP, Si, or equivalent, and the Fabry-Perot filters forming the passive resonant optical cavities are made of epitaxially grown layers from the GaAs/AlGaAs material system (i.e., alternating layers of GaAs and AlGaAs), grown on the same substrate. Wavelength stepping of the filters can be accomplished by various schemes during epitaxial growth, or by etching and regrowth after an initial epitaxial growth. In the process of etching, the longitudinal level of the stop-etching layer in the second Bragg reflection mirror can be staggered in succession laterally across the array of optical cavities so that the vertical dimension is stepped up laterally.

According to a second fabrication technique, the substrate is glass, the microlenses are made of reflowed spin-on polymer or diffused impurity, and the Fabry-Perot filters are made of deposited dielectric layers. In this case the wavelength stepping is accomplished during deposition or by etching and redeposition after an initial deposition. Both techniques change the height of the cavity so that the vertical (i.e., longitudinal) resonance varies laterally across the structure. Combinations of features from the first and second fabrication techniques can also be employed.

Operating as a demultiplexer, the optical device receives a wavelength-division multiplexed (WDM) optical signal through a microlens with an anti-reflective coating applied thereto, and separates N (an integer number of) channels (i.e., packets) corresponding to N different wavelengths from the optical signal. The laterally extending array of passive resonant optical cavities are each tuned to resonate at one or more of the wavelengths to capture laser radiation having such wavelength and transmit it from that cavity through a mirror transmissive to such wavelength. The remaining channels of the optical signal are reflected and refocused using a microlens, having a high-reflective coating applied thereto, associated with the next resonant optical cavity, and so on through the series of optical cavities.

The optical device can be operated in reverse as a multiplexer to interleave several wavelengths of laser radiation into a multiplexed optical signal. Wavelength division multiplexing with this optical device utilizes a row of microlenses to focus, collimate, and reflect the optical signal toward an outgoing single-mode or multi-mode optical fiber, which can carry the laser beam signal.

A stepped-wavelength steered laser radiation source for the optical device operating as a multiplexer uses a bottom-emission VCSEL array with offset microlenses to steer laser beams at angles in accordance with the principles of the invention.

With an additional row of microlenses the optical device can be used for other types of wavelength routing and channel dropping applications.

A stepped-wavelength WDM VCSEL array can be fabricated and processed in a manner similar to that previously described for the passive WDM filter array embodiment to form a WDM combiner or multiplexer.

Other features and advantages of the invention will become apparent from the following detailed description, taken in conjunction with the accompanying drawings, which illustrate, by way of example, the features of the invention.

BRIEF DESCRIPTION OF THE DRAWINGS

In the drawings:

FIG. 5 is a schematic elevational view of a stepped-wavelength WDM VCSEL array in accordance with the principles of the invention.

DETAILED DESCRIPTION

The invention provides a compact surface-illuminated multiplexer-demultiplexer optical device for wavelength-division multiplexing (WDM) applications, which has low insertion loss characteristics, using a Fabry-Perot filter array (or an array of equivalent filters which may or may not use Bragg reflectors) extending in a lateral direction integrated with one or more microlens arrays, each of which extends in the lateral direction.

Figure 1:
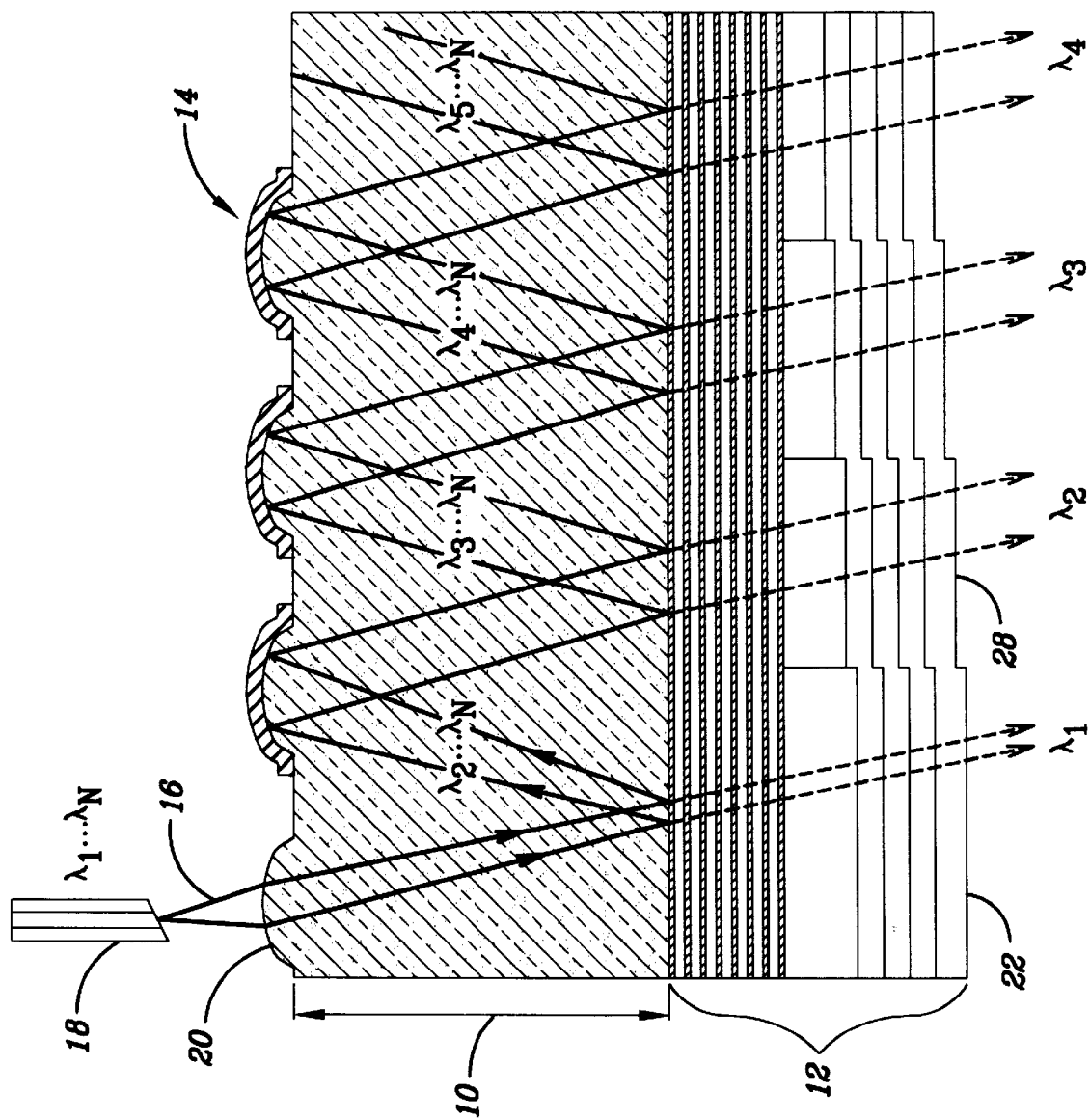
FIG. 1 is a schematic elevational view of a WDM demultiplexer in accordance with the principles of the invention.

A monolithic WDM demultiplexer for receiving laser radiation containing N (an integer number) different wavelengths is shown in FIG. 1. The demultiplexer includes a semiconductor substrate 10. The semiconductor material (or materials) can be selected from the group consisting of GaAs, InP, GaP, Si, and equivalents. An array 12 of wavelength-stepped Fabry-Perot (or equivalent) filters is disposed laterally in a series in contact with the substrate 10. Each of the Fabry-Perot filters in the series has a central longitudinal axis. An array 14 of microlenses is disposed in a row on the substrate 10. Each of the array 14 of microlenses has a center which is offset (i.e., laterally displaced) from the central longitudinal axis of an associated Fabry-Perot filter. Microlenses and processes for making them are described in detail in copending U.S. application Ser. No. 08/635,798 filed Apr. 22, 1996, entitled "VERTICAL CAVITY LASERS WITH MONOLITHICALLY INTEGRATED REFRACTORY MICROLENSES" (now abandoned) which is incorporated by reference as if fully set forth herein.

For demultiplexing several incoming wavelengths of laser radiation 16 from an optical fiber 18, a first microlens 20, having an anti-reflective coating applied thereto, in the array 14 of microlenses is illuminated with all N laser wavelengths from the optical fiber 18. The single-mode or multi-mode optical fiber 18 carries a laser beam signal. This lens 20 re-images or collimates the fiber radiation, which impinges on a first Fabry-Perot filter (passive resonant optical cavity) 22. The filter 22 transmits a first wavelength $\lambda_1$, and reflects the remaining wavelengths. These remaining wavelengths then are reflected and collimated by a second microlens 24 having a high-reflective coating 26 applied thereto, and directed to the second Fabry-Perot filter 28 in the array 12. This next filter 28 transmits a second wavelength $\lambda_2$ and reflects the remaining wavelengths. A third microlens 30 coated with a high-reflective coating 32 reflects and collimates the remaining wavelengths, and so on through the series, until all the wavelengths have been transmitted through their respective Fabry-Perot filters. The separated wavelengths can, for example, be directed to photodetectors in a receiver application, or to separate optical fibers in a wavelength routing application.

In a first implementation of the optical device, the substrate 10 and microlenses 14 are made of GaAs, and the Fabry-Perot filter array 12 is made of epitaxially grown alternating layers of GaAs and AlGaAs. In a second implementation, the substrate 10 is made of glass, the microlenses 14 are made of diffused impurity or reflowed polymer, and the Fabry-Perot filter array 12 is made of deposited dielectric layers. Combinations of features from the first and second implementations can also be used.

Figure 2:
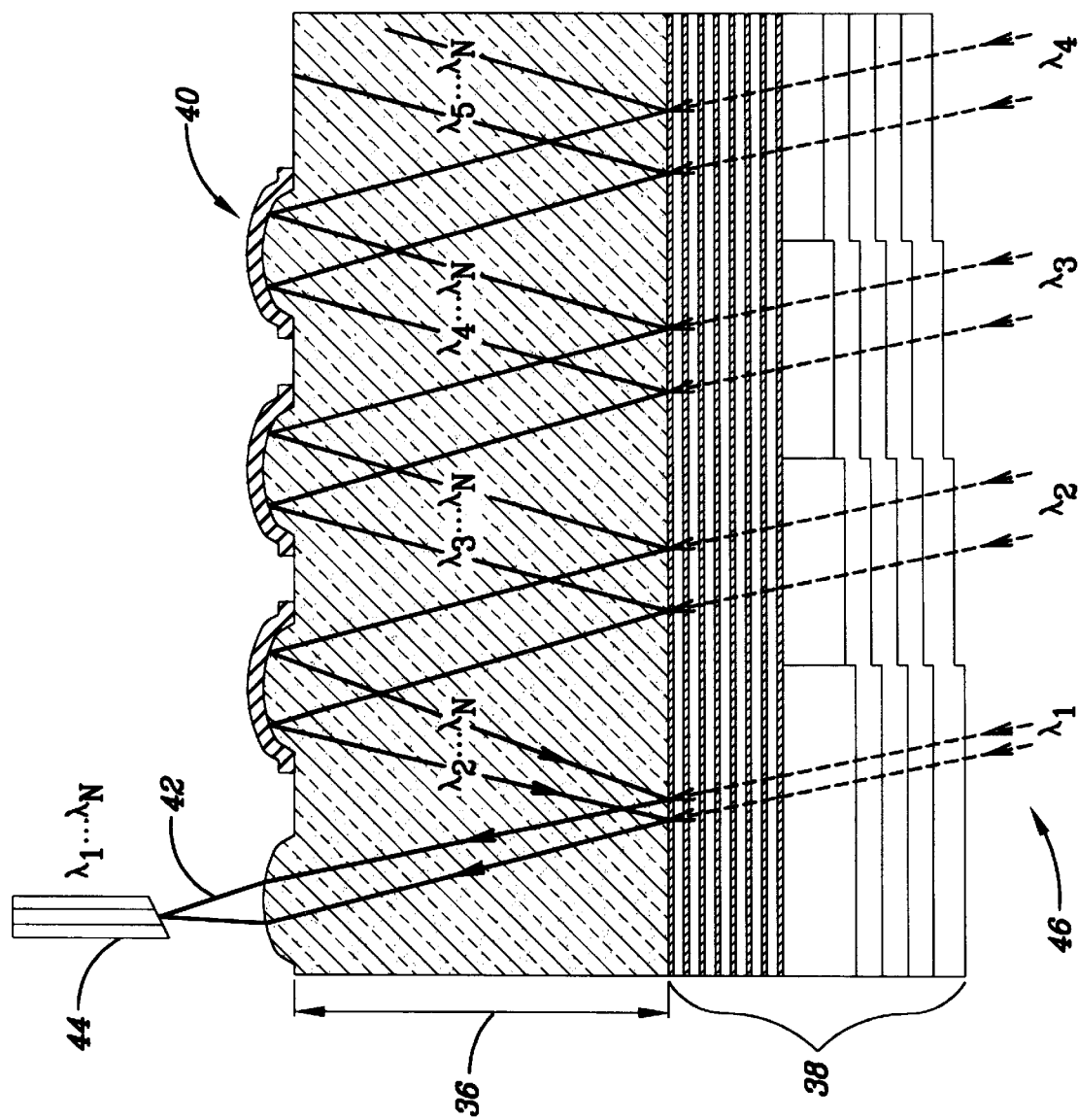
FIG. 2 is a schematic elevational view of a WDM multiplexer in accordance with the principles of the invention.

When the optical device is operated in reverse it can be used for multiplexing. A wavelength-division multiplexing (WDM) multiplexer for transmitting N different wavelengths of laser radiation is shown in FIG. 2. The multiplexer includes a semiconductor substrate 36. An array 38 of wavelength-stepped Fabry-Perot filters extending in a lateral direction is in contact with the substrate 36. An array 40 of offset microlenses is disposed in a row extending in the lateral direction on the substrate 36. The center of each of the microlenses in the array is displaced from the central longitudinal axis of an associated Fabry-Perot filter to focus, collimate, and reflect laser radiation 42 through the Fabry-Perot filter array 38.

Figure 3:
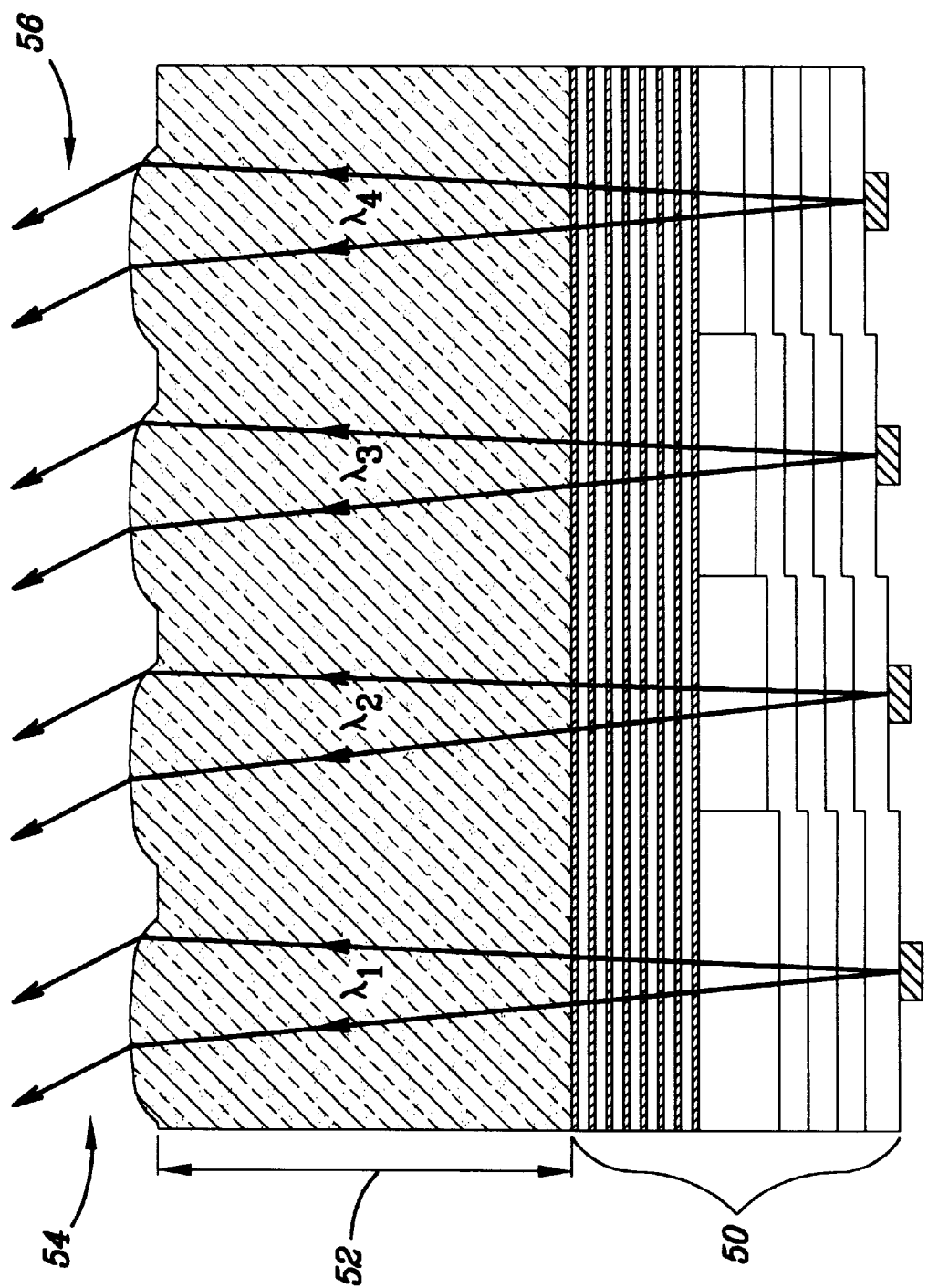
FIG. 3 is a schematic elevational view of a stepped-wavelength steered laser radiation source using a bottom-emission VCSEL array with offset microlenses in accordance with the principles of the invention.

To multiplex several wavelengths into the single outgoing optical fiber 44 positioned on one side (e.g., top) of the multiplexer, various beam sources 46 must impinge at an angle to the opposite side (e.g., bottom) of the multiplexer. A source of organized laser beams which have different wavelengths, and which will impinge at an angle to the opposite side of the multiplexer is illustrated by FIG. 3. The steered laser beam source includes a stepped-wavelength bottom-emission VCSEL array 50 in confronting relation with a GaAs substrate 52. The VCSEL array extends in the lateral direction. Each VCSEL of the array includes an optical cavity having a central longitudinal axis, and is tuned to transmit at least one of the N wavelengths from one of its mirrors through the substrate 52. The wavelength-stepped VCSEL array 50 is associated with its own set 54 of microlenses. Each microlens is positioned so that its center is offset (i.e., laterally displaced) from the central longitudinal axis of an associated VCSEL. The set 54 of microlenses is disposed in a row extending in the lateral direction on the substrate 52 to focus and direct the laser beams 56 to the WDM multiplexer shown in FIG. 2. The offset microlenses steer the various wavelength beams at an angle toward the multiplexer.

Figure 4:
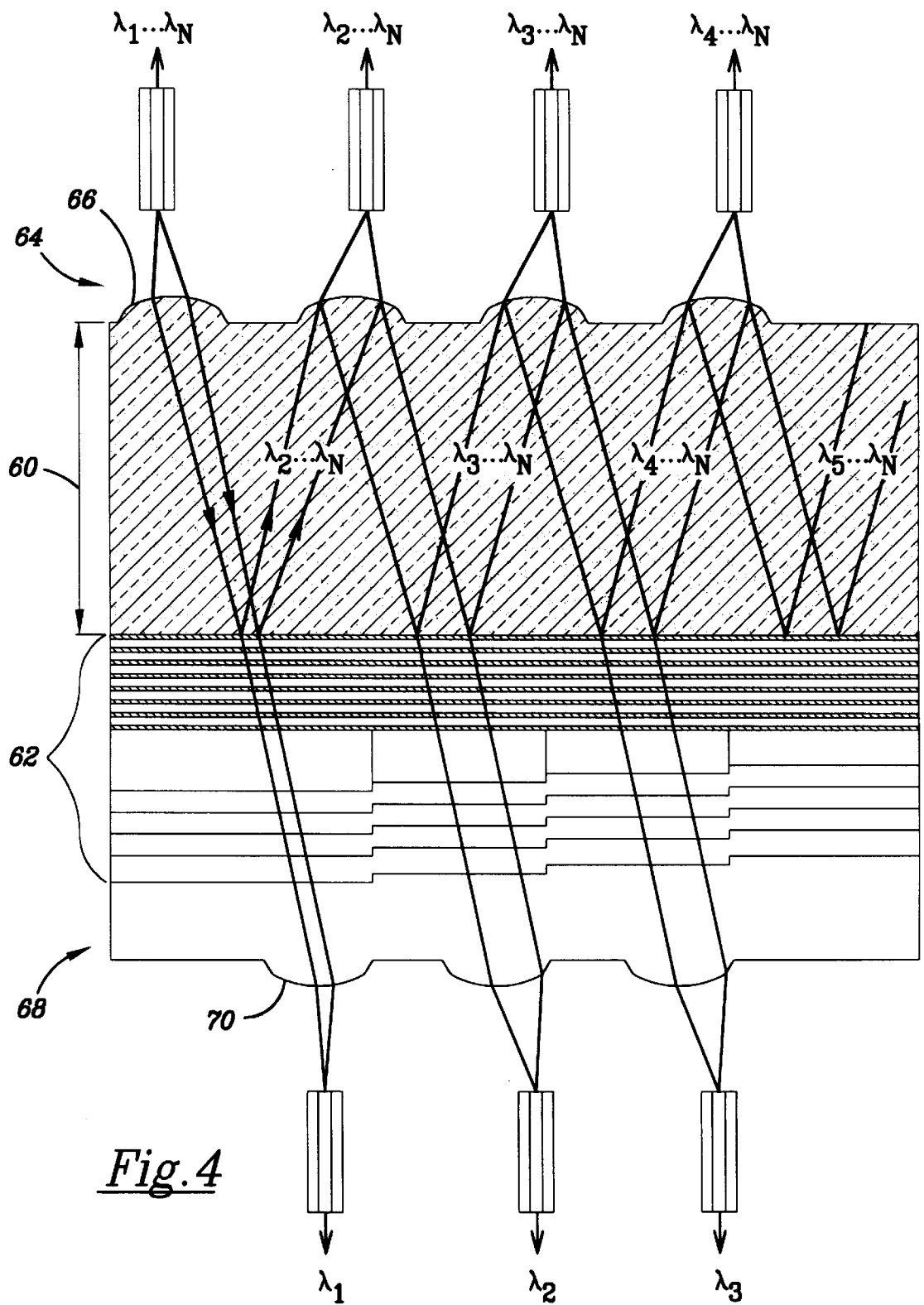
FIG. 4 is a schematic elevational view of an optical device useful for wavelength routing and channel dropping in accordance with the principles of the invention.

A monolithic optical device for wavelength routing radiation containing N different wavelengths is shown in FIG. 4. The optical device includes a semiconductor substrate 60. An array 62 of wavelength-stepped Fabry-Perot filters is in contact with the substrate 60 and extends in a lateral direction. A top row 64 of microlenses is disposed on the face of the substrate 60 opposite from the Fabry-Perot filter array 62 and extending in the lateral direction. Each microlens in the top row has a center which is offset from the central longitudinal axis of an associated Fabry-Perot filter. An anti-reflective coating is disposed on one of the microlenses 66 in the top row 64. A bottom row 68 of microlenses (which could be regrown GaAs) extending in the lateral direction is disposed on the Fabry-Perot filter array 62 on the opposite side of the filter array from the top row 64 and the substrate 60. Each microlens in the bottom row has a center which is displaced from the central longitudinal axis of an associated Fabry-Perot filter. An anti-reflective coating is disposed on at least one of the microlenses 70 in the bottom row 68.

Optical devices can be implemented according to the invention using a variety of different techniques. In one implementation, the substrate and microlenses are made of GaAs, and the Fabry-Perot filters are made of epitaxially grown layers from the GaAs/AlGaAs material system, grown on the same GaAs substrate. The wavelength stepping of the filters can be accomplished by various schemes during epitaxial growth, or by etching and regrowth after an initial epitaxial growth. In another implementation, the substrate is glass, the microlenses are made of reflowed spin-on polymer or diffused impurity, and the Fabry-Perot filters are made of deposited dielectric layers. In this case the wavelength stepping is accomplished during deposition or by etching and redeposition after an initial deposition. During an implementation using etching, the longitudinal depth of the stop-etching layer of one of the Bragg reflection mirrors is staggered in series laterally across the array of optical cavities so that the vertical (i.e., longitudinal) resonance varies laterally across the completed structure. Combinations of features of both implementations can be utilized. The optical devices have theoretical insertion losses of less than about two dB for eight channels, can be tested without cleaving and can be integrated into a compact package.

FIG. 5 shows an additional application of the inventive passive WDM filter array technique in a stepped-wavelength WDM four-VCSEL array and illustrates the wafer-scale nature by which these devices are fabricated. A vertical cavity surface emitting laser (VCSEL) is inherently a Fabry-Perot filter. The VCSEL cavity will strongly reflect light whose emission wavelength is different than the VCSEL emission. A stepped-wavelength WDM VCSEL array can be made using similar techniques as those previously described for the passive filter array.

Referring to FIG. 5, a WDM VCSEL array includes a plurality of layers of semiconductor and can be fabricated by growing a bottom DBR (distributed Bragg reflector) mirror stack 72 on a substrate 74, followed by an active region 76 disposed on the bottom mirror stack 72, and some spacer layers, which may include part of a mirror stack, forming a spacer region 78. The spacer region 78 is then etched longitudinally (i.e., vertically) in a controlled fashion to provide a step etch, that is each VCSEL laterally across the VCSEL array will have a slightly different longitudinal spacer region thickness. Then the top DBR mirror stack 80 is finished via dielectric or semiconductor deposition (or regrowth). Vertical etching, ion implantation, or other means can be used for current confinement in the bottom-emitting VCSELs. In the exemplary VCSEL array shown in FIG. 5, the VCSELs depicted are ion-implanted for current confinement and each of the VCSELs have a metallized contact 82, 84, 86, 88 applied to the top mirror stack 80 for electrical pumping.

The active gain region 76 of the VCSEL array, which extends laterally across the VCSEL array, emits coherent electromagnetic radiation at a very broad bandwidth. Because of the different amount of vertical etching for the spacer region 78 through each of the VCSELs laterally across the VCSEL array, each VCSEL will emit from the bottom mirror stack region 72 into the substrate 74 at a slightly different wavelength selected by the longitudinal dimension of the spacer region 78 within that VCSEL (which functions as a filter for a particular bandwidth section of the broad electromagnetic radiation bandwidth emitted by the active region) and each will strongly reflect the light emitted by the other VCSELs.

The WDM VCSEL array can then be processed like the passive WDM filter array taught herein to form a WDM combiner or multiplexer. An array 90 of microlenses are fabricated on the back side of the VCSEL wafer (i.e., on the back side of the substrate 74). Each microlens has a center, which is located (with reference to the lateral axis) intermediate the two nearest VCSELs in the wafer. This results in a portion of the light emitted by a VCSEL into the substrate 74 being reflected and focused by the appropriate microlens.

Referring to FIG. 5, each of the VCSELs emits a particular wavelength (e.g., $\lambda_1$, $\lambda_2$, $\lambda_3$ and $\lambda_4$) into the substrate 74. The particular wavelength emitted by a VCSEL depends upon the longitudinal (i.e., vertical) dimension of the spacer region 78 therein. FIG. 5 shows that starting with $\lambda_4$ and proceeding to $\lambda_1$, all the different wavelengths are joined together and then focused into an optical fiber 92. The metallized contacts 82, 84, 86, 88 serve to identify where current is confined laterally across the wafer.

Coherent electromagnetic radiation having a wavelength $\lambda_4$ is emitted from the VCSEL having metallized contact 82. The radiation having wavelength $\lambda_4$ is reflected from a first microlens 94 having a high-reflective coating 96 applied thereto. The radiation having wavelength $\lambda_4$ is then reflected from the bottom mirror stack 72, at which point it joins with radiation having a wavelength $\lambda_3$ emitted from the VCSEL in the VCSEL array having metallized contact 84. Radiation having both wavelengths $\lambda_4$ and $\lambda_3$ is reflected toward the second microlens 98. The second microlens 98 has a high-reflective coating 100 applied thereto. The second microlens 98 reflects the radiation having both wavelengths $\lambda_4$ and $\lambda_3$ toward the bottom mirror stack 72. The radiation having both wavelengths $\lambda_4$ and $\lambda_3$ reflects from the bottom mirror stack 72 and combines at the bottom mirror stack 72 with radiation having a wavelength of $\lambda_2$ emitted from the VCSEL in the array having metallized contact 86. Radiation having three wavelengths $\lambda_4$, $\lambda_3$, and $\lambda_2$ is reflected toward the third microlens 102. The third microlens 102 has a high-reflective coating 104 applied thereto. The radiation having three wavelengths $\lambda_4$, $\lambda_3$, and $\lambda_2$ is reflected toward the bottom mirror stack 72. The radiation having three wavelengths $\lambda_4$, $\lambda_3$, and $\lambda_2$ reflects from the bottom mirror stack, at which point it joins with radiation having a wavelength $\lambda_1$, which is emitted from the VCSEL of the array which has metallized contact 88. The radiation containing four wavelengths $\lambda_4$, $\lambda_3$, $\lambda_2$ and $\lambda_1$ travels toward the fourth microlens 106, which does not have applied thereto a high-reflective coating, but instead has an antireflective coating 108 applied thereto. Therefore, the multiplexed radiation having the four wavelengths $\lambda_4$, $\lambda_3$, $\lambda_2$ and $\lambda_1$ is transmitted through the fourth microlens 106 and is emitted therefrom. The fourth microlens 106 focuses the radiation containing the four wavelengths $\lambda_4$, $\lambda_3$, $\lambda_2$ and $\lambda_1$ into the optical fiber 92. Thus, the WDM VCSEL array according to the invention multiplexes four discrete wavelength bands (i.e., channels) into a single optical fiber.

With the prescribed placement of the microlenses, less than about half of the power of each of the VCSELs will be coupled into the optical fiber. This makes the product less efficient than a simple 2×1 optical coupler but much more efficient than larger optical couplers (e.g., 16×1 couplers). Also this built-in WDM system is much smaller than comparable fiber systems and is much less expensive to manufacture.

The optical devices according to the invention can be monolithically integrated, and as a result are much more compact and inexpensive to manufacture than previous WDM devices. Devices made according to the invention consume only a few millimeters of on-wafer length which is approximately an order of magnitude less than previous approaches for a comparable number of channels.

While several particular forms of the invention have been illustrated and described, it will also be apparent that various modifications can be made without departing from the spirit and scope of the invention.

What is claimed is:

1. A wavelength-division multiplexing (WDM) optical device for use in transmitting and receiving N different wavelengths of laser radiation, comprising:
    a first substrate;
    an array of wavelength-stepped Fabry-Perot filters in contact with the first substrate, wherein each filter has a central longitudinal axis;
    a first array of microlenses disposed on the first substrate, wherein each microlens has a center which is displaced from the central longitudinal axis of an associated Fabry-Perot filter
    a stepped-wavelength vertical cavity surface emitting laser (VCSEL) array optically coupled with the wavelength-stepped Fabry-Perot array of filters, wherein each VCSEL has a central vertical axis, and is tuned to transmit at least one of the N different wavelengths of laser radiation;
    a second substrate in contact with the stepped-wavelength VCSEL array; and
    a second array of microlenses disposed on the second substrate, wherein each microlens has a center which is offset from the central vertical axis of an associated VCSEL.

2. An optical device as defined in claim 1, further comprising:
    an incoming optical fiber for delivering the laser radiation to one of the first array of microlenses.

3. An optical device as defined in claim 1, further comprising:
    a high-reflective coating applied to at least one of the first array of microlenses.

4. An optical device as defined in claim 1, wherein:
    the array of filters is epitaxially grown on the substrate.

5. An optical device as defined in claim 1, wherein:
    the array of filters is deposited on the substrate.

6. An optical device as defined in claim 1, further comprising:
    an anti-reflective coating applied to one of the first array of microlenses.

7. An optical device as defined in claim 1, wherein:
    each filter transmits at least one of the N different wavelengths of laser radiation.

8. An optical device as defined in claim 1, further comprising:
    an outgoing optical fiber for receiving the laser radiation from one of the first array of microlenses.

9. An optical device as defined in claim 1, wherein:
    the second substrate includes a semiconductor material selected from the group consisting of GaAs, InP, GaP, and Si.

10. An optical device as defined in claim 1, wherein:
    each VCSEL is a bottom-emitting VCSEL.

* * * * *